United States Patent [19]

Stallkamp

[11] Patent Number: 4,721,943
[45] Date of Patent: Jan. 26, 1988

[54] DIGITAL-TO-ANALOG CONVERTER FOR VIDEO APPLICATION

[75] Inventor: Richard W. Stallkamp, Tigard, Oreg.

[73] Assignee: Tektronix, Inc., Beaverton, Oreg.

[21] Appl. No.: 786,447

[22] Filed: Oct. 11, 1985

[51] Int. Cl.[4] .............................................. H03M 1/66
[52] U.S. Cl. ............................... 340/347 DA; 315/367;
315/383; 315/384; 315/385; 340/704; 340/793;
340/825.43; 340/347 M; 358/81; 358/82;
358/168
[58] Field of Search .................... 315/367, 383–385;
358/81, 82, 168; 340/825.78, 825.43, 701, 704,
732, 793

[56] References Cited

U.S. PATENT DOCUMENTS 3,961,326 6/1976 Craven ....................... 340/347 DA
4,575,714 3/1986 Rummel ................... 340/825.78 X

*Primary Examiner*—T. J. Sloyan
*Attorney, Agent, or Firm*—John Smith-Hill; Robert S. Hulse

[57] ABSTRACT

A digital-to-analog converter comprises a current source for supplying a current of predetermined magnitude to a circuit node, and a switch connected to the circuit node, and defining a first current path leading to a reference potential terminal and a second current path leading to an output terminal. The switch has an input terminal, at which it receives a first digital signal of one binary digit for conversion to analog form, and also has a reference terminal, and has a first condition, when the voltage at the reference terminal is higher than that at the input terminal, in which the current supplied to the circuit node is delivered to the output terminal, and a second condition, when the voltage at the reference terminal is lower than that at the input terminal, in which the current is delivered to the reference potential terminal. The converter also comprises a level shifting network which receives a second digital signal of one binary digit and generates an output signal having a voltage that depends on whether the second digital signal is a logical zero or a logical one; this output signal is applied to the switch's reference terminal. If the second digital signal is a logical zero, the voltage of the output signal lies intermediate the voltage levels corresponding to the first signal's being a logical zero and a logical one, and if the second digital signal is a logical zero, the voltage of the output signal is higher than the voltage level corresponding to the first signal's being a logical one.

10 Claims, 1 Drawing Figure

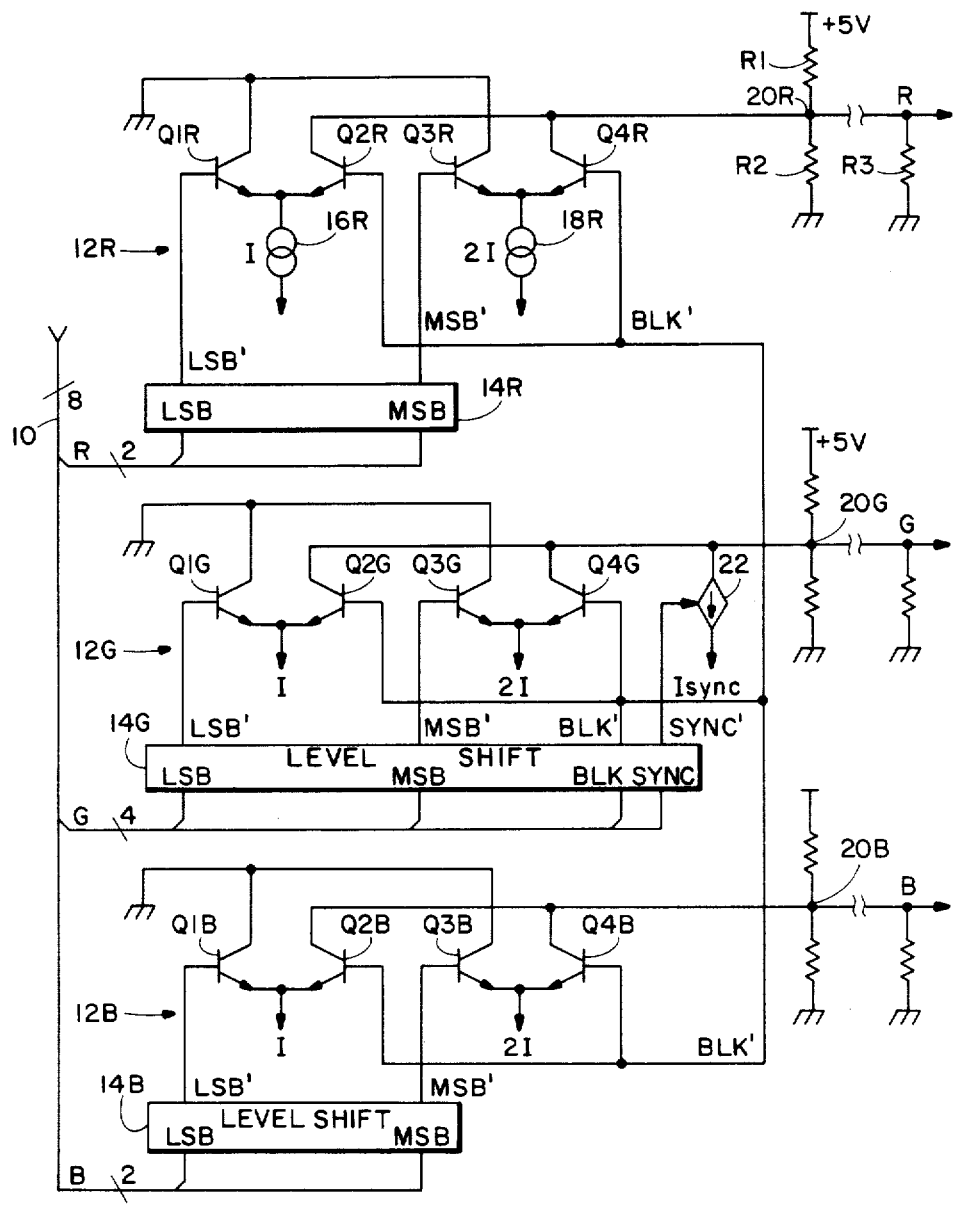

DIGITAL-TO-ANALOG CONVERTER FOR VIDEO APPLICATION

BACKGROUND OF THE INVENTION

A color graphics terminal having a cathode-ray-tube (CRT) display monitor generally includes a frame buffer in which information representing the distribution of color over the screen of the CRT is stored. The addressable memory locations in the frame buffer are associated on a one-to-one basis with the pixels of the display, and each addressable location is capable of storing a digital word comprising four binary digits or bits, representing one of 16 possible colors for the associated pixel. The four-bit words are read from the frame buffer in timed relationship to the scanning of the terminal's display screen, to provide a four-bit parallel signal. The four-bit parallel signal is converted into three two-bit parallel signals. Each set of three two-bit words represents the contributions of three primary color components (red, green and blue) to the color of the associated pixel. Two one-bit signals, representing blanking information and sync information respectively, are also generated. The three two-bit color signals and the one-bit blanking signal are logically combined in such manner that if blanking is asserted the color signals are each driven to 00 whereas if blanking is not asserted the color signals are unchanged. The three two-bit color signals, modified by the blanking signal, are applied to a DAC system in which they are compared with reference voltages, and three analog signals are generated. The one-bit sync signal is used to add sync information to at least one of the analog signals during the blanking interval, and the resulting three analog signals are applied to respective output amplifiers. Each amplifier either has an output impedance of 75 ohms or is connected to an impedance matching network having an output impedance of 75 ohms, in order to facilitate matching to the monitor input terminals. The analog output signals of the three amplifiers are used to drive the three electron guns of the CRT.

The conventional color video DAC system is subject to the disadvantage that it has a high parts count and a large number of different parts. Accordingly, manufacture and calibration of the conventional DAC system is expensive.

SUMMARY OF THE INVENTION

A preferred form of digital-to-analog converter embodying the present invention comprises a current source for supplying a current of predetermined magnitude to a circuit node, and a switch connected to the circuit node and defining a first current path leading to a reference potential terminal and a second current path leading to an output terminal. The switch has an input terminal, at which it receives a first digital signal of one binary digit for conversion to analog form, and also has a reference terminal, and has a first condition, when the voltage at the reference terminal is higher than that at the input terminal, in which the current supplied to the circuit node is delivered to the output terminal, and a second condition, when the voltage at the reference terminal is lower than that at the input terminal, in which the current is delivered to the reference potential terminal. The converter also comprises a level shifting network which receives a second digital signal of one binary digit and generates an output signal having a voltage that depends on whether the second digital signal is a logical zero or a logical one. If the second digital signal is a logical zero, the voltage of the output signal lies intermediate the voltage levels corresponding to the first signal's being a logical zero and a logical one, and if the second digital signal is a logical one, the voltage of the output signal is higher than the voltage level corresponding to the first signal's being a logical one. The output signal of the level shifting network is applied to the reference terminal of the switch.

BRIEF DESCRIPTION OF THE DRAWING

For a better understanding of the invention, and to show how the same may be carried into effect, reference will now be made, by way of example, to the accompanying drawing, the single figure of which is a simplified circuit diagram, partly in schematic form and partly in block form, of a color video DAC system.

DETAILED DESCRIPTION

The illustrated color video DAC system has an input line 10 on which it receives a stream of parallel eight bit words. Two color information bits (an MSB and an LSB) are applied to DACs 12R, 12G and 12B respectively, for generating analog signals to drive the red, green and blue electron guns of a color CRT (not shown). The bits on the line 10 have TTL voltage levels, such that a voltage of 0 to 0.8 volts on a conductor of the line 10 represents a digital zero and a voltage of 2.0 to 5.0 volts on the conductor represents a digital one.

Each of the DACs 12 includes a level shifter 14 which receives the LSB and the MSB of the appropriate digital color information signal. The level shifter 14G receives the remaining two bits of each eight bit word on the line 10, representing blanking information and sync information respectively. The level shifters 14 translate the positive TTL voltage levels received from the line 10 to negative voltage levels LSB', MSB', BLK' and SYNC'. The voltage level corresponding to logical zero for LSB and MSB might be, for example, $-5.3$ volts and the voltage level corresponding to logical one might then be $-2.4$ volts. The voltage levels corresponding to BLK and /BLK might be $-0.2$ and $-3.4$ volts, and the voltage levels corresponding to SYNC and /SYNC might be $-18$ and $-19$ volts. The signals LSB' and MSB' are applied to the bases of respective transistors Q1 and Q3, and the signal BLK' is applied to the bases of transistors Q2 and Q4. Each pair of transistors Q1, Q2 and Q3, Q4 is connected in common emitter configuration, the emitters of the transistors of each pair being connected to a current source. The current source 16 connected to the transistors Q1 and Q2 supplies a current I, while the current source 18 connected to the transistors Q3 and Q4 supplies a current 2I. In a practical implementation, I might be 8.2 mA. Each pair of transistors Q1, Q2 and Q3, Q4 forms a current switching comparator that determines whether the current supplied by the source 16 or 18 is drawn from an output terminal 20 or from ground.

When the signal BLK is asserted, the negative voltage signal BLK' has a value such that the transistors Q2 and Q4 conduct the currents I and 2I respectively, regardless of the condition of LSB and MSB, and consequently the entire current 3I is drawn from the output terminal 20 with the result that the terminal 20 is pulled to a low voltage. If, while BLK is asserted, SYNC is also asserted, the level-shifted signal SYNC' switches on a logic controlled current source 22 which draws additional current I SYNC (e. g. 2 mA) from the terminal 20G, resulting in the terminal 20G being drawn to a still lower voltage. It will be understood that SYNC is not asserted except when BLK is asserted.

If BLK is not asserted, the negative voltage logic signal BLK' has a value between the voltage levels associated with LSB' and MSB' being logical zero and logical one. Therefore, when BLK is not asserted and LSB or MSB is at logical zero, the current supplied by the source 16 or 18, as the case may be, is conducted by the transistors Q2 or Q4 and is drawn from the output terminal 20. When BLK is not asserted and LSB or MSB is at logical one, the current supplied by the source 16 or 18 is drawn from ground through the transistor Q1 or Q3. The collector currents of the transistors Q2 and Q4 are summed, and provided that BLK is not asserted the aggregate current has four possible values depending upon the values of LSB and MSB.

The terminal 20 is connected to a resistor network comprising resistors R1 and R2. In the case of a conventional color monitor employing 75 ohm transmission lines, the resistance values of the resistors R1 and R2 are chosen so that when the terminal 20 is connected to an open circuit the voltage at the terminal can swing between $-0.8$ volts and $+2$ volts, and the output resistance at the terminal 20 is 75 ohms. In the case of the current values indicated previously, the resistance values of R1 and R2 are 191 ohms and 124 ohms respectively. When the terminal 20 is connected to a transmission line that is terminated with a resistor R3 having a resistance value of 75 ohms, the voltage at the terminal 20 swings between $-0.4$ volts and 1 volt, in accordance with normal video standards.

The color video DAC system illustrated in the figure provides the advantage of relatively small total component count, and relatively few different components. For example, the comparators are all identical, and the level shifting networks are identical except that the network 14G must provide level shifting for four signals. Moreover, the need for output amplifiers is avoided. In addition, by referencing all of the current sources from the same reference value, and by use of precision resistors, inherent calibration is achieved. By generating the signal BLK' in only one channel, the need to apply BLK to the other two channels and include level shifters for BLK in those channels is avoided. By using the signal BLK' as the reference voltage in the comparators, the operations of combining the blanking signal with the color signals and comparing the modified color signals with reference voltages are combined into a single operation.

It will be appreciated that the present invention is not restricted to the particular color video DAC that has been shown and described, and that variations may be made therein without departing from the scope of the invention as defined in the appended claims, and equivalents thereof. For example, the BLK and SYNC signals may be applied to the red DAC channel or the blue DAC channel instead of to the green DAC channel, and indeed the BLK and SYNC signals may be applied to different DAC channels. Greater resolution may be provided by increasing the number of color information bits for one or more of the DAC channels, and increasing correspondingly the number of current switches and current sources.

I claim:

1. A digital-to-analog converter (DAC) for converting a digital signal of at least a first binary digit to analog form, comprising:
   a first level shifting circuit having an input terminal at which it receives the first binary digit and also having an output terminal, the first level shifting circuit being operative to generate a first outpt voltage level when the first binary digit has a first value and a second output voltage level when the first binary digit has a second value,
   a second level shifting circuit having an input terminal at which it receives a second digital signal of one binary digit and also having an output terminal, the second level shifting circuit being operative to generate a first output voltage level, outside the range of output voltage levels provided by the first level shifting circuit, when the binary digit of the second digital signal has a first value, and to generate a second output voltage level, within the range of output voltage levels provided by the first level shifting circuit, when the binary digit of the second digital signal has a second value,
   a current source for supplying a current of predetermined magnitude to a circuit node, and
   a comparator connected to the circuit node and defining a first current path leading from the circuit node to a reference potential terminal and a second current path leading from the circuit node to an output terminal of the DAC, the comparator having a signal input terminal connected to the output terminal of the first level shifting circuit and also having a reference terminal connected to the output terminal of the second level shifting circuit, and having a first condition, when the output voltage of the second level shifting circuit is at its first level and regardless of whether the output voltage of the first level shifting circuit is at its first or second level, in which the current supplied to the circuit node is delivered to the output terminal of the DAC, a second condition, when the output voltage of the second level shifting circuit is at its second level and the output voltage of the first level shifting circuit is at its first level, in which the current is delivered to the output terminal, and a third condition, when the output voltage of the second level shifting circuit is at its second level and the output voltage of the first level shifting circuit is at its second level, in which the current is delivered to the reference potential terminal.

2. A digital-to-analog converter (DAC) for converting a first digital signal of at least a first binary digit to analog form, comprising:
   a level shifting circuit having an input terminal at which it receives a second digital signal of one binary digit and also having an output terminal, the level shifting circuit being operative to generate a first output voltage level, outside the range of voltage levels of the first digital signal, when the binary digit of the second digital signal has a first value, and to generate a second output voltage level, within the range of voltage levels of the first digital signal, when the binary digit of the second digital signal has a second value,
   a current source for supplying a current of predetermined magnitude to a circuit mode, and
   a comparator having a reference terminal which is connected to the output terminal of the level shifting circuit and also having a signal input terminal at which it receives the first digital signal, the comparator being connected to the circuit node and defining a first current path leading from the circuit node to a reference potential terminal and a second current path leading from the circuit node to an output terminal of the DAC, and being operable in response to the first binary digit and the second digital signal and having a first condition, when the binary digit of the second signal has said first value and regardless of the value of said first digit, in which the current supplied to the circuit node is delivered to the output terminal of the DAC, a second condition, when the binary digit of the second signal has said second value and said first digit has a first value, in which the current is delivered to the output terminal of the DAC, and a third condition, when the binary digit of the second signal has said second value and said first digit has a second value, in which the current is delivered to the reference potential terminal.

3. A digital-to-analog converter for converting a digital signal of at least a first binary digit to analog form, comprising:

a first current source for supplying a current of a first predetermined magnitude to a first circuit node, a second current source for supplying a current of a second predetermined magnitude, different from said first predetermined magnitude, to a second circuit node, a first switch connected to the first circuit node and defining a first current path leading from the first circuit node to a reference potential terminal and a second current path leading from the first circuit node to an output terminal, the first switch being operable in response to the first binary digit and a second digital signal of one biary digit and having a first condition, when the binary digit of the second signal has a first value and regardless of the value of said first digit, in which the current supplied to the first circuit node is delivered to the output terminal, a second condition, when the binary digit of the second signal has a second value and said first digit has a first value, in which the current is delivered to the output terminal, and a third condition, when the binary digit of the second signal has said second value and said first digit has a second value, in which the current is delivered to the reference potential terminal, and a second switch connected to the second circuit node and defining a first current path leading from the second circuit node to the reference potential terminal and a second current path leading from the second circuit node to the output terminal, the second switch being operable in response to the second digital signal and a second binary digit of the first digital signal and having a first condition, when the binary digit of the second has said first value and regardless of the value of said second digit, in which the current supplied to the second circuit node is delivered to the output terminal, a second condition, when the binary digit of the second signal has said second value and said second digit has a first value, in which the current is delivered to the output terminal, and a third condition, when the binary digit of the second signal has said second value and said second digit has a second value, in which the current is delivered to the reference potential terminal.

4. A digital-to-analog converter (DAC) system for converting a plurality of digital signals, each of at least a first binary digit, to analog form, comprising at least first and second DAC channels for receiving and converting the digital signals respectively, each DAC channel comprising:

a current source for supplying a current of predetermined magnitude to an associated circuit node, and a switch connected to the circuit node and defining a first current path leading to a reference potential terminal and a second current path leading to an output terminal, the switch being operable in response to the first binary digit of one of the digital signals and a digital disabling signal of one binary digit and having a first condition, when the binary digit of the disabling signal has a first value and regardless of the value of said first digit, in which the current applied to the associated circuit node is delivered to the output terminal, a second condition, when the binary digit of the disabling signal has a second value and said first digit has a first value, in which the current is delivered to said output terminal, and a third condition, when the binary digit of the disabling signal has said second value and said first digit has a second value, in which the current is delivered to the reference potential terminal, each switch being a comparator having a reference terminal and also having a signal input terminal at which it receives the first or second digital signal, and one of the DAC channels comprising a level shifting circuit having an input terminal at which it receives the disabling digital signal and an output terminal connected to the reference terminal of the comparator of each DAC channel, the level shifting circuit being operative to generate a first output voltage level, outside the range of voltage levels of the first and second digital signals, when the binary digit of the disabling digital signal has said first value, and to generate a second output voltage level, within the range of voltage levels of the first and second digital signals, when the binary digit of the disabling signal has said second value.

5. A DAC system according to claim 4, wherein the number of DAC channels is three.

6. A DAC system according to claim 4, wherein at least one of said DAC channels includes a digitally-controlled current source connected to said output terminal and operable in response to a further binary digit to adjust the current delivered to the output terminal by said digitally-controlled current source.

7. Apparatus for generating an analog component video signal having three color components from a digital signal comprising a blanking signal, a sync signal and three color words each having at least a first binary digit, said apparatus comprising:

first, second and third DAC channels for receiving and converting the color words respectively, each DAC channel comprising a current source for supplying a current of predetermined magnitude to an associated circuit node, a switch connected to the circuit node and defining a first current path leading to a reference potential terminal and a second current path leading to an output terminal of the DAC channel, the switch being operable in response to the first binary digit of one of the color words and the blanking signal and having a first condition, when the blanking signal has a first value and regardless of the value of said first digit, in which the current supplied to the associated circuit node is delivered to the output terminal, a second condition, when the blanking signal has a second value and said first digit has a first value, in which the current is delivered to said output terminal, and a third condition, when the blanking signal has said second value and said first digit has a second value, in which the current is delivered to the reference potential terminal.

first, second and third voltage dividers each comprising first and second resistor elements connected in series between an upper reference potential level and a lower reference potential level and a top intermediate the first and second resistor elements, the taps of the first, second and third voltage dividers being connected to the output terminals of the first, second and third DAC channels respectively, and a controllable current source connected to the output terminal of the first DAC channel and responsive to the sync signal to supply a current of a first value to the output terminal of the first DAC channel in the event that the sync signal has a first voltage level and to supply a current of a second value if the sync signal has a second voltage level.

8. Apparatus according to claim 7, wherein the switch of each DAC channel is a comparator having a reference terminal and also having a signal input terminal at which it receives the first binary digit, and the apparatus also comprises a reference level circuit having an input terminal at which it receives the blanking signal and an output terminal connected to the reference terminal of each comparator, the reference level circuit being operative to generate a first output voltage level, outside the range of voltge levels associated with the first and second values of the first digit of a color word, when the blanking signal has said first value, and to generate a second output voltage level, intermediate the voltage levels associated with the first and second values of the first digit of a color word, when the blanking signal has said second value.

9. Apparatus according to claim 8, wherein each DAC channel includes a level shift circuit having an output terminal connected to the signal input terminal of the comparator and also having an input terminal, the level shift circuit being responsive to its input terminal having a first input voltage level to generate at its output terminal the voltage level associated with the first value of the first digit of a color word and being responsive to its input terminal having a second input voltage level to generate at its output terminal the voltage level associated with the second value of the first digit of a color word, and wherein the reference level circuit is responsive to it input terminal having one of said first and second input voltage levels to generate said first output voltage level and to its input terminal having the other of said first and second second input voltage levels to generate said second output voltage level.

10. A circuit according to claim 9, wherein the reference level circuit has a second output terminal which is connected to the controllable current source and also has a second input terminal, the reference level circuit being responsive to its second input terminal having one of said first and second input voltage levels to generate at its second output terminal a voltage level suitable to cause the controllable current source to supply a current of said first value and to its second input terminal having the other of said first and second input voltage levels to generate at its second output terminal a voltage level suitable to cause the controllable current source to supply a current of said second value.

* * * * *